United States Patent
Yao et al.

(10) Patent No.: US 11,127,477 B1
(45) Date of Patent: Sep. 21, 2021

(54) E-FUSE CIRCUIT

(71) Applicant: Elite Semiconductor Microelectronics Technology Inc., Hsinchu (TW)

(72) Inventors: Tse-Hua Yao, Hsinchu (TW); Yi-Fan Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/076,827

(22) Filed: Oct. 22, 2020

(51) Int. Cl.
| | | |
|---|---|---|
| *G11C 17/16* | (2006.01) | |
| *G11C 29/00* | (2006.01) | |
| *G11C 29/02* | (2006.01) | |

(52) U.S. Cl.
CPC ............ *G11C 17/16* (2013.01); *G11C 29/027* (2013.01); *G11C 29/789* (2013.01); *G11C 2229/763* (2013.01)

(58) Field of Classification Search
CPC ..... G11C 17/16; G11C 29/027; G11C 29/789; G11C 2229/763
See application file for complete search history.

(56) References Cited

U.S. PATENT DOCUMENTS

| | | | | |
|---|---|---|---|---|
| 6,577,546 B2 * | 6/2003 | Fujiwara | ................ | G11C 29/14 365/201 |
| 7,952,950 B2 * | 5/2011 | Miyatake | ............... | G11C 17/18 365/225.7 |
| 8,780,603 B2 * | 7/2014 | Kim | ........................ | G11C 17/16 365/96 |
| 9,576,680 B1 * | 2/2017 | Lee | ........................ | G11C 29/24 |
| 10,008,292 B1 | 6/2018 | Yao | | |
| 10,629,282 B1 | 4/2020 | Yao | | |
| 10,672,495 B1 | 6/2020 | Yao | | |
| 2020/0265905 A1 | 8/2020 | Mori | | |

\* cited by examiner

*Primary Examiner* — Vanthu T Nguyen
(74) *Attorney, Agent, or Firm* — Winston Hsu (57) ABSTRACT

An E-fuse circuit comprising: an E-fuse group, comprising a plurality of E-fuse sections, wherein each one of the E-fuse sections comprises a plurality of E-fuses; a multi-mode latch circuit, configured to receive an input signal to generate a first output signal in a burn in mode, and configured to receive an address to be compared to generate a second output signal in a normal mode; a first logic circuit group, configured to receive a first part of bits of the first output signal to generate a control signal in the burn in mode; and a second logic circuit group, configured to receive the control signal and a second part of bits of the first output signal to generate a selection signal in the burn in mode, to select which one of the E-fuse sections is activated.

10 Claims, 7 Drawing Sheets

E-FUSE CIRCUIT

BACKGROUND OF THE INVENTION

1. Field of the Invention

The present invention relates to an E-fuse circuit, and particularly relates to an E-fuse circuit which can reduce required circuit area.

2. Description of the Prior Art

A conventional memory comprises an E-fuse circuit with redundant memory cells. Such E-fuse circuit records addresses of damaged memory cells and is used to determine whether the memory cell to be accessed is a damaged memory cell, to determine whether the memory cell to be accessed should be replaced with a redundant memory cell. For a conventional memory device, while selecting the E-fuse to be written, a large number of latches are usually required to temporarily store the selection signals, and a decoder with a complex logic design is required. However, with the advancement of technology, the density of memory cells is getting higher and higher. Therefore, the number of redundant memory cells and the number of E-fuses correspondingly increases, and the numbers of required latch circuits and required decoders also correspondingly increase, which raises the required space required of a memory.

SUMMARY OF THE INVENTION

One objective of the present invention is to provide an E-fuse circuit which can share circuits to save circuit areas.

One embodiment of the present invention is to provide an E-fuse circuit comprising: an E-fuse group, comprising a plurality of E-fuse sections, wherein each one of the E-fuse sections comprises a plurality of E-fuses; a multi-mode latch circuit, configured to receive an input signal to generate a first output signal in a burn in mode, and configured to receive an address to be compared to generate a second output signal in a normal mode; a first logic circuit group, configured to receive a first part of bits of the first output signal to generate a control signal in the burn in mode; and a second logic circuit group, configured to receive the control signal and a second part of bits of the first output signal to generate a selection signal in the burn in mode, to select which one of the E-fuse sections is activated.

In view of above-mentioned embodiments, the present invention can share the latch circuit in the normal mode and the burn in mode, and the logic circuit used in the present invention can share the circuit with the conventional comparison circuit, so that the area required for the circuit can be reduced. In addition, the present invention replaces the decoder in the prior art with a simpler logic circuit, which can reduce the complexity of circuit design.

These and other objectives of the present invention will no doubt become obvious to those of ordinary skill in the art after reading the following detailed description of the preferred embodiment that is illustrated in the various FIGS. and drawings.

DETAILED DESCRIPTION

Following embodiments are used to explain the concepts of the present invention. Please note, the term "first", "second", "third" in following descriptions are only for the purpose of distinguishing different elements or signals, and do not mean the sequence thereof.

Figure 1:
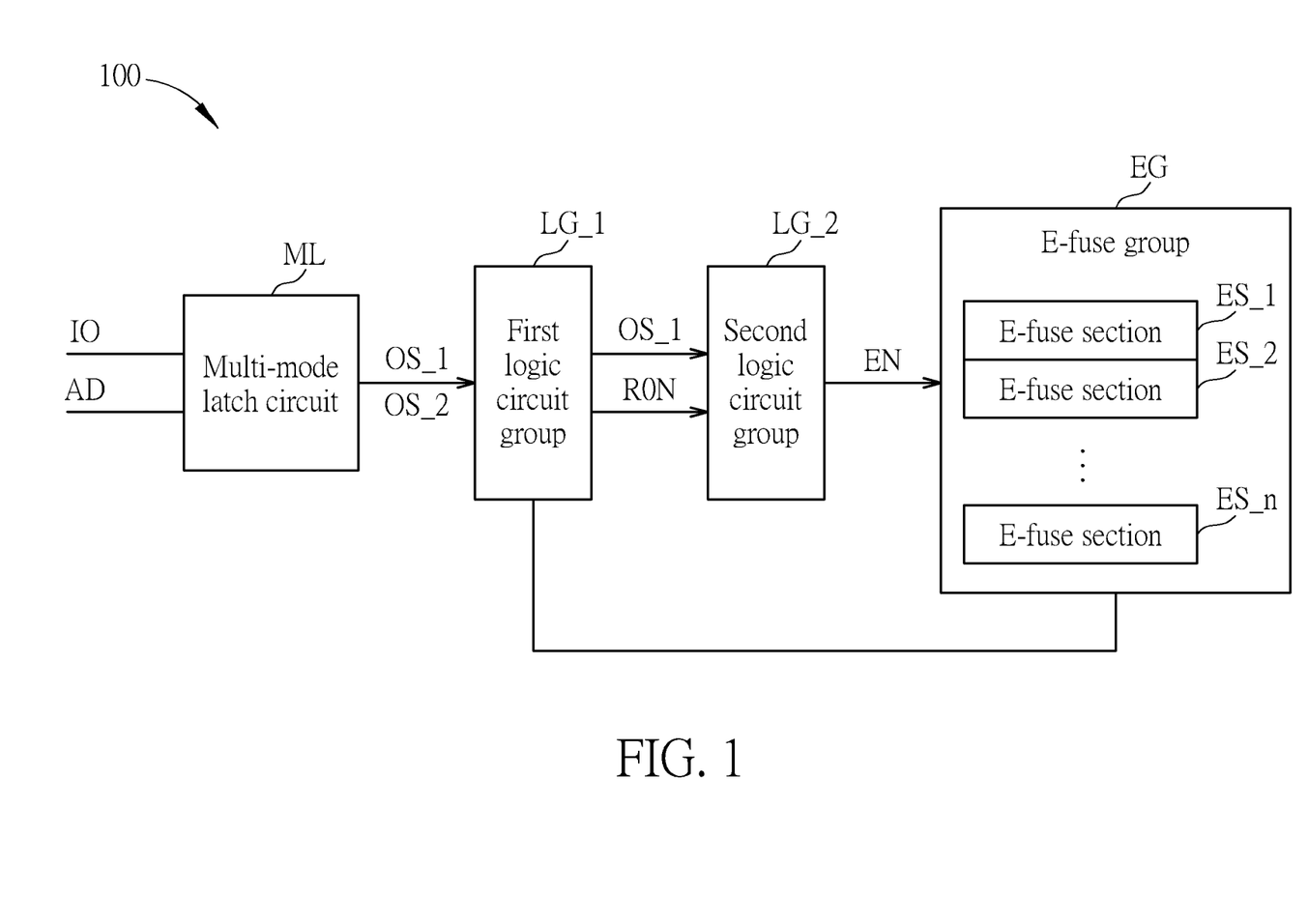
FIG. 1 is a block diagram illustrating an E-fuse circuit according to one embodiment of the present invention.

FIG. 1 is a block diagram illustrating an E-fuse circuit according to one embodiment of the present invention. As shown in FIG. 1, the E-fuse circuit 100 comprises a multi-mode latch circuit ML, a first logic circuit group LG_1, a second logic circuit group LG_2, and an E-fuse group EG. The first logic circuit group LG_1 comprises at least one first logic circuit LG_11-LG_1n (not shown), and the second logic circuit group LG_1 comprises at least one second logic circuit LG_21-LG_2n (not shown). The E-fuse group EG comprises a plurality of E-fuse sections ES_1, ES_2 . . . ES_n, and each of the E-fuse sections ES_1, ES_2 . . . ES_n comprises a plurality of E-fuses (not shown in this FIG.). The multi-mode latch circuit ML is configured to receive the input signal IO input in serial to generate the first output signal OS_1 output in parallel in the burn in mode, and to receive the address be compared AD input in serial to generate the second output signal OS_2 output in parallel in the normal mode. The first logic circuit group LG_1 receives the first part of the bits of the first output signal OS_1 to generate a control signal RON in the burn in mode. The second logic circuit group LG_2 receives the second part of bits of the first output signal OS_1 and the control signal RON to generate a selection signal EN in the burn in mode, to select which one of the E-fuse section in the E-fuse group EG is activated. In one embodiment, the first logic circuit group LG_1 can be used in the normal mode to compare the second output signal OS_2 with the error address FA (that is, the address of the damaged memory cell) stored in the E-fuse group EG to determine the whether the address AD is an error address, to perform the replacement of the redundant memory cell.

Figure 2:
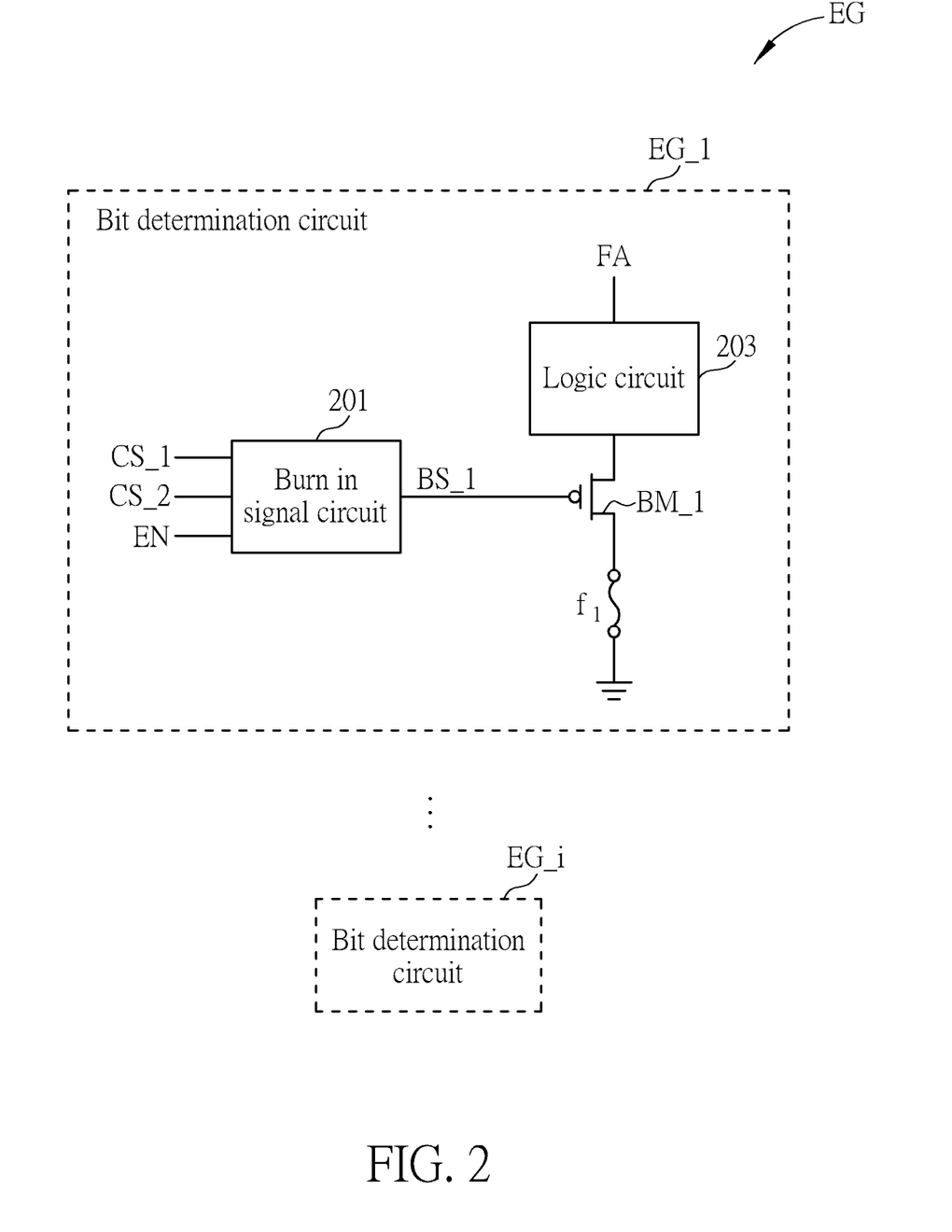
FIG. 2 is a block diagram illustrating an E-fuse according to one embodiment of the present invention.

FIG. 2 is a block diagram illustrating an E-fuse according to one embodiment of the present invention. As shown in FIG. 2, the E-fuse group EG comprises i-bit bit determination circuits EG_1-EG_i. The burn in signal circuit 201 in the bit determination circuit EG_1 receives the first switch signal CS_1, the second switch signal CS_2 and the selection signal EN generated by the second logic circuit group LG_2 in FIG. 1. The first switch signal CS_1 and the second switch signal CS_2 can be generated by different circuits based on the input signal IO. For example, the first switch signal CS_1 and the second switch signal CS_1 may be generated by the circuit disclosed in the US patent with a patent number U.S. Ser. No. 10/629,282, but the invention is not limited to such circuit. The selection signal EN is the enable signal of the bit determination circuit EG_1, which determines whether the bit determination circuit EG_1 is enabled or not.

When the bit determination circuit EG_1 is enabled, the first switch signal CS_1 and the second switch signal CS_2 generate the burn in signal BS_1. In the example in FIG. 2, if the logic value of the burn in signal BS_1 is 0, the burn in switch BM_1 is turned on such that the fuse f1 is burned in, thereby the error address FA is changed.

The bit determination circuit EG_i comprises the same circuit structure as the bit determination circuit EG_1. However, please note that in the following examples, based on the logical values of the example signals and logic values of data shown in FIG. 2, persons skilled in the art can understand that the logical values of the signals and data can be changed according to the circuit structure of the E-fuse circuit EG, to achieve the same function.

Figure 3:
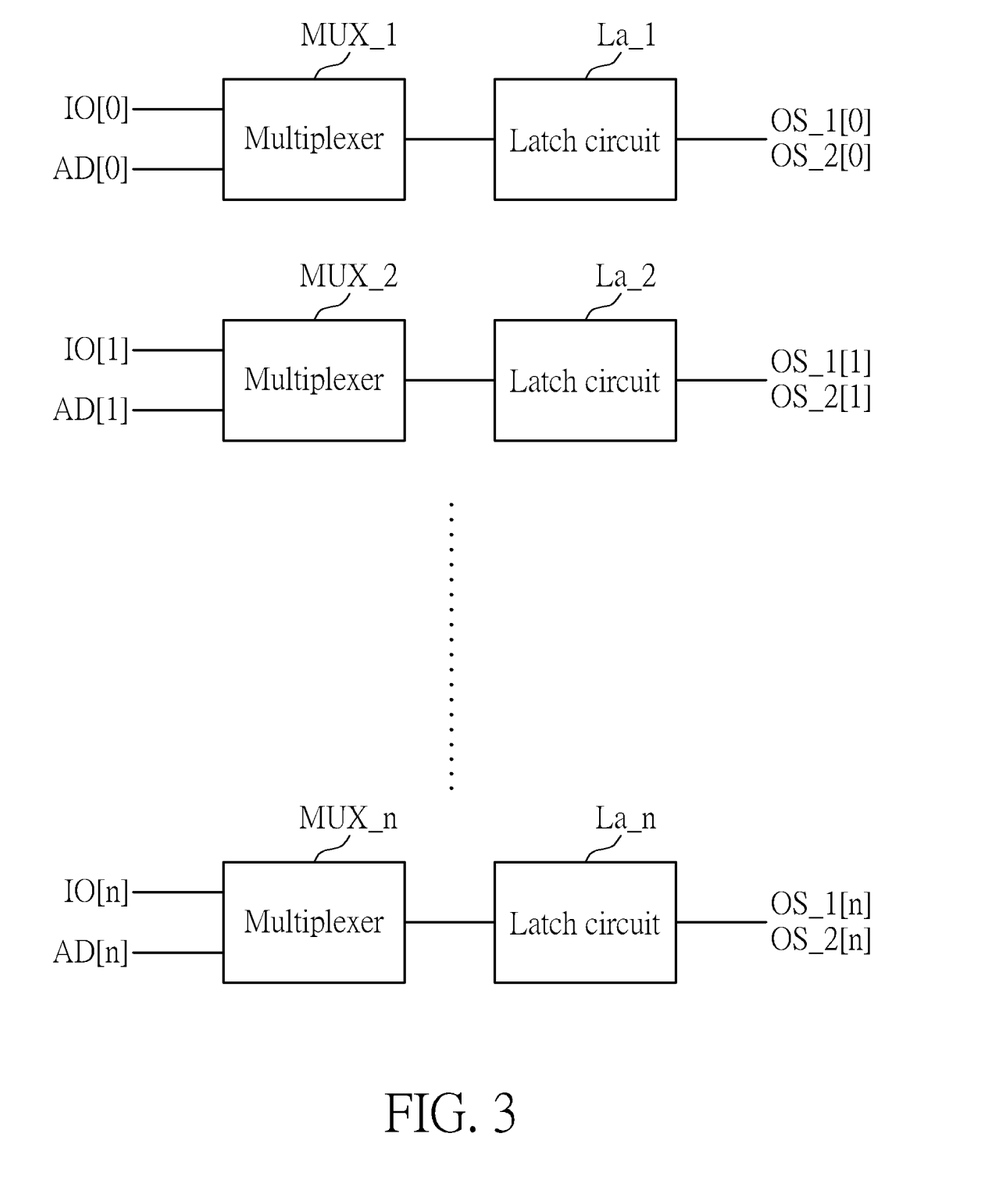
FIG. 3 is a block diagram illustrating a multi-mode latch circuit of an E-fuse circuit according to one embodiment of the present invention.

FIG. 3 is a block diagram illustrating a multi-mode latch circuit ML of an E-fuse circuit according to one embodiment of the present invention. As shown in FIG. 3, the multi-mode latch circuit ML in FIG. 1 comprises a plurality of multiplexers MUX_1-MUX_n and a plurality of latch circuits La_1-La_n in FIG. 3. The multiplexers MUX_1-MUX_n are configured to receive different bits IO[0]-IO[n] of the input signal IO input in serial in the burn in mode and output these bits to the latch circuits La_1-La_n respectively. Also, in the normal mode, the different bits AD[0]-AD[n] of the addresses to be compared AD input in serial are received by the multiplexers MUX_1-MUX_n, and these bits are respectively output to the latch circuits La_1-La_n. The latch circuits La_1-La_n are configured to generate different bits OS_1[0]-OS1[m] of the first output signal OS_1 according to the different bits IO[0]-IO[n] of the input signal IO in the burn in mode, and configured to generate different bits OS_2[0]-OS_2[n] of the second output signal OS_2 according to the different bits AD1-AD[n] of the address AD to be compared in the normal mode.

In one embodiment, the first output signal OS_1 is an m-bit signal output in parallel, and the second output signal OS_2 is an n-bit signal output in parallel. Both m and n are positive integers and m is less than n. In such case, in the burn in mode, the latch circuit La_1-La_n can only enable m multiplexers and latch circuits. Alternatively, the latch circuit La_1-La_n can still generate bits OS_1[0]-OS1[n], but only the elements corresponding to the bits OS_1[0]-OS1[m] in the following first logic circuit and the second logic circuit are enabled. Such changes should also fall in the scope of the present invention.

Figure 4:
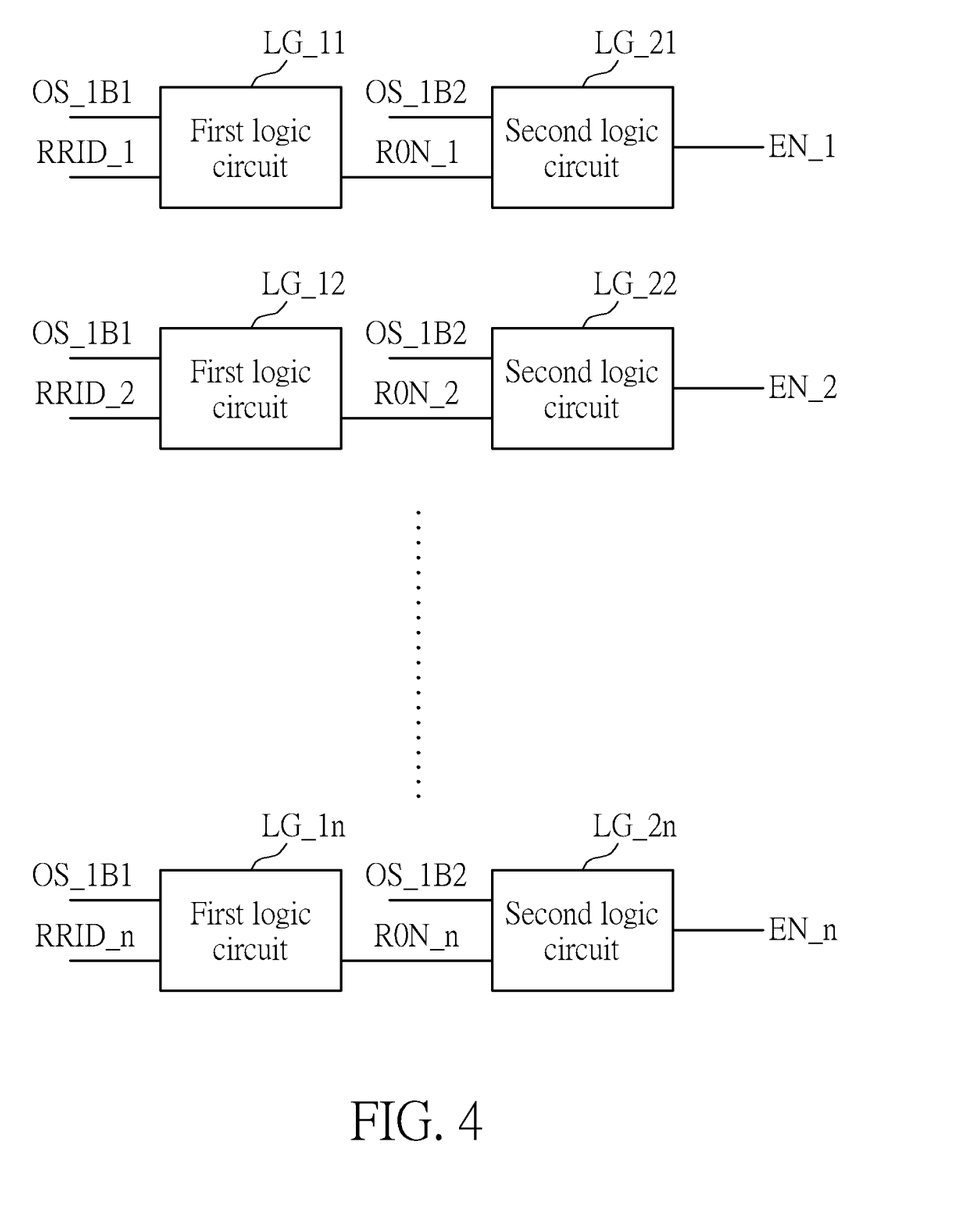
FIG. 4 is a block diagram illustrating a first logic circuit group and a second logic circuit group of an E-fuse circuit according to one embodiment of the present invention.

FIG. 4 is a block diagram illustrating a first logic circuit group LG_1 and a second logic circuit group LG_2 of an E-fuse circuit according to one embodiment of the present invention. As shown in FIG. 4, the first logic circuit group LG_1 shown in FIG. 1 comprises n first logic circuits LG_11-LG1*n*, and the second logic circuit group LG_2 shown in FIG. 1 comprises n second logic circuit LG_21-LG2*n*. The first logic circuits LG_11-LG1*n* respectively receive the aforementioned partial bits OS_1B1 of the first output signal OS_1, and the second logic circuits LG_21-LG2*n* respectively receive the aforementioned other partial bits OS_1_B2 of the first output signal OS_1. The second logic circuits LG_21-LG2*n* respectively generate different selection signals EN_1-EN_n according to other partial bits OS_1_B2 and corresponding control signals R0N_1-R0N_n.

Figure 5:
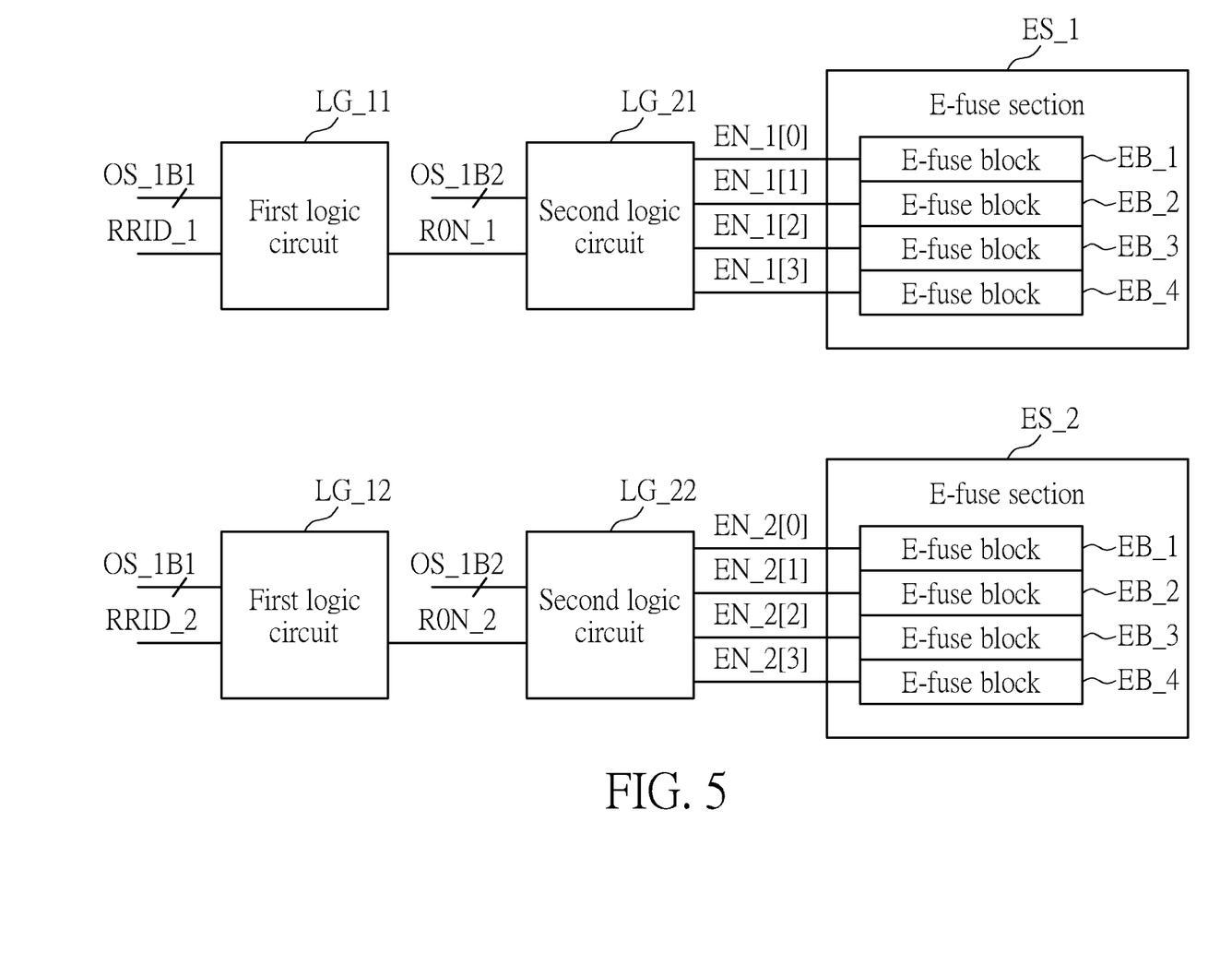
FIG. 5 is a block diagram illustrating an E-fuse circuit according to another embodiment of the present invention.

In order to describe the operations of the E-fuse circuit of the present invention in the burn in mode in detail, FIG. 5 uses two first logic circuits LG_11, LG1_12, two second logic circuits LG_21, LG_22, and two E-fuse sections ES_1 and ES_2 as examples for explaining. Other first logic circuits, second logic circuits, and E-fuse sections can also have the same operations. In such embodiment, the other bits OS_1_B2 of the first output signal OS_1 are AN[1:2], so the second logic circuits LG_21 and LG_22 generate a 4-bit selection signal EN after the decoding of AN[1:2]. That is, the selection signals EN_1 and EN_2 are 4-bit signals output in parallel. Corresponding to the bit numbers of the selection signals EN_1 and EN_2, each of the E-fuse sections ES_1-ES_2 is divided into four E-fuse blocks EB_1-EB_4. Therefore, the selection signal EN_1 is used to select which one of E-fuse block EB_1-EB_4 in the E-fuse section ES_1 is enabled, and the selection signal EN_2 is used to select which one of the E-fuse blocks EB_1-EB_4 in the E-fuse section ES_2 is enabled. In such embodiment, each of the E-fuse blocks EB_1-EB_4 comprises 11 E-fuses (not shown). For example, if the E-fuse block EB_1 is selected and enabled by the selection signal EN_1[0], the fuses of the E-fuse block E-fuse block EB_1 will be burned in to generate an error address FA.

In addition, in the burn in mode, each E-fuse section ES_1, ES_2 in FIG. 5 respectively has its own identification codes RRID_1, RRID_2, which are unique. In this embodiment, the first logic circuit LG_11 receives the first part of bits OS_1B1 (for example, AN[3:12]) of the first output signal OS_1 and compares it with the identification code RRID_1 to generate the control signal R0N_1. Also, the second logic circuit LG_12 receives the first part of bits OS_1B1 of the first output signal OS_1 and compares it with the identification code RRID_2 to generate the control signal R0N_2. When the control signal R0N_1=1, it means that the first part of bits OS_1B1 of the first output signal OS_1 is the same as the identification code RRID_1, that is, the input signal IO in FIG. 1 is designated to activate the E-fuse section ES_1. Similarly, when the control signal R0N_2=1, it means that the input signal IO in FIG. 1 is designated to activate the E-fuse section ES_2. After confirming which of the E-fuse sections ES_1 and ES_2 is to be activated, the second logic circuit LG_21, LG_22 decodes the second part of bits OS_1_B2 of the first output signal OS_1 (for example, AN[1:2]) to generate the 4-bit selection signal (EN_2[0:3]), to select which one of the E-fuse blocks EB_1-EB_4 is enabled.

Figure 6:
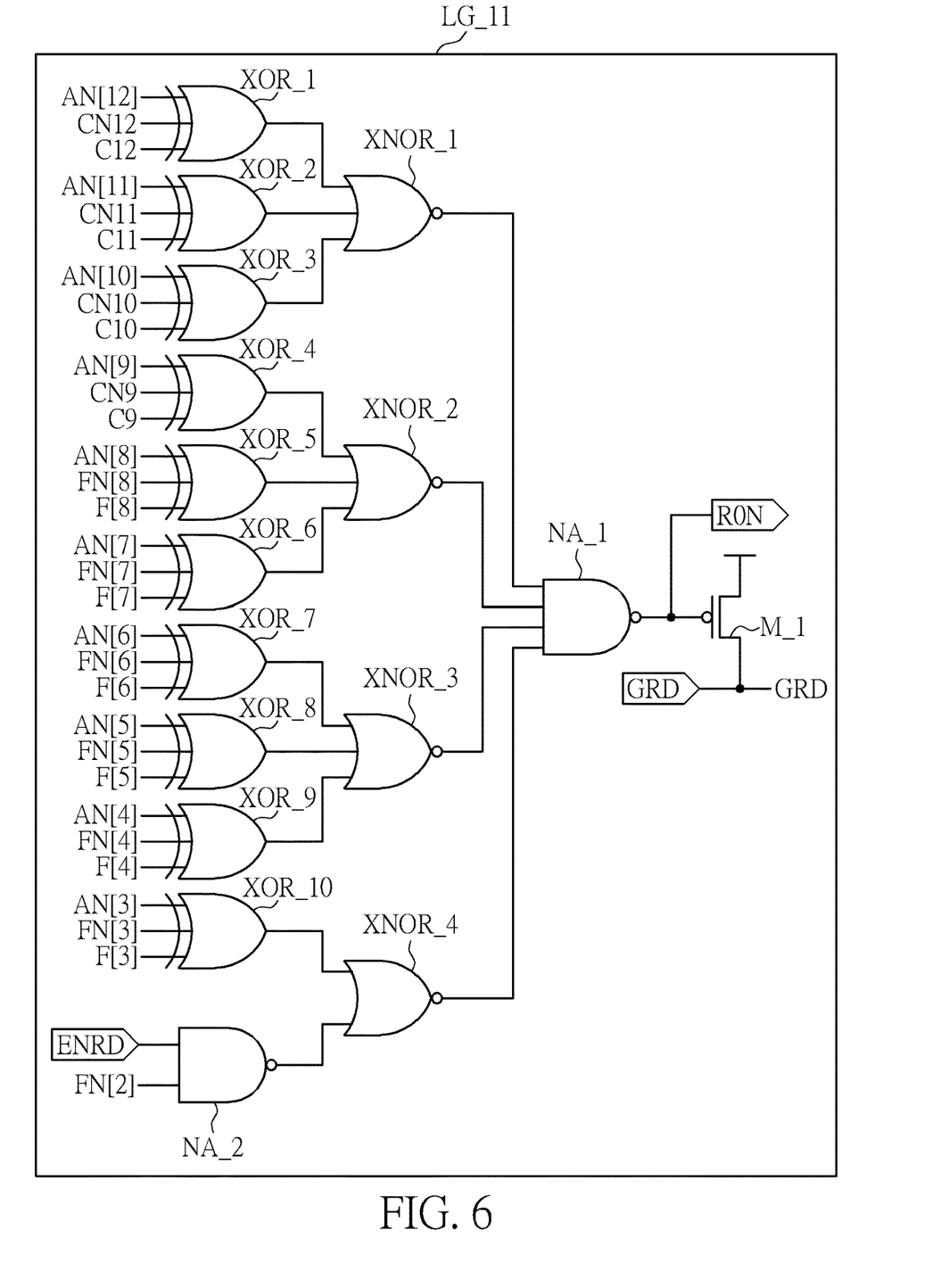
FIG. 6 is a circuit diagram illustrating a first logic circuit of an E-fuse circuit according to one embodiment of the present invention.
Figure 7:
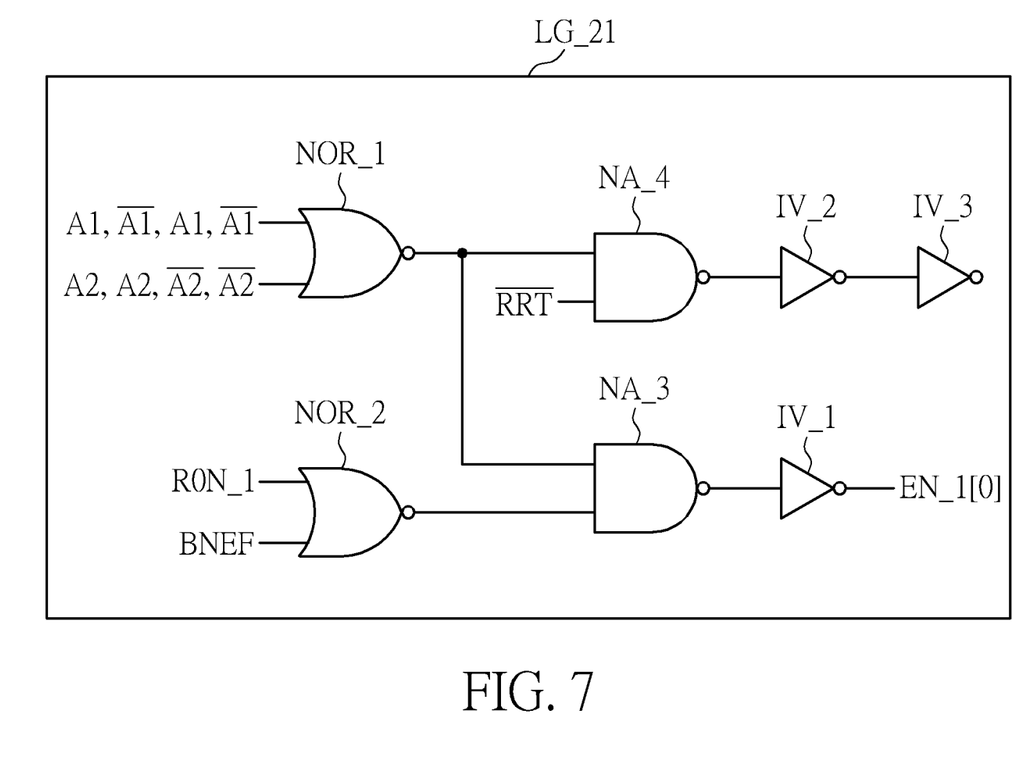
FIG. 7 is a circuit diagram illustrating a second logic circuit of an E-fuse circuit according to one embodiment of the present invention.

FIG. 6 is a circuit diagram illustrating a first logic circuit LG_11 of an E-fuse circuit according to one embodiment of the present invention, and FIG. 7 is a circuit diagram illustrating a second logic circuit LG_21 of an E-fuse circuit according to one embodiment of the present invention. However, please note that the circuit structures shown in FIG. 6 and FIG. 7 are only for examples, and do not mean to limit the present invention. persons skilled in the art can modify the circuit structure shown in FIG. 6 and FIG. 7 based on the aforementioned contents to achieve the same function, and such variation should be comprised in the scope of the present invention. In addition, in the related descriptions of FIGS. 6 and 7, only the first logic circuit LG_11 and the second logic circuit LG_21 are used as examples, but other first logic circuits and second logic circuits may comprise the same circuit structure.

As shown in FIG. 6, the first logic circuit LG_11 comprises a plurality of logic units (in this example, XOR gates XOR_1-XOR_10), these logic units receive different bits (such as AN[9:12]) of the first output signal OS_1 in parallel in the burn in mode, to generate the control signal R0N. Also, these logic units receive different bits (such as AN[3:12]) of the second output signal OS_2 in parallel and the error addresses F[3:8] and C[9:12] stored in the E-fuse group EG in the normal mode, to compare whether the address to be compared AD is the error address FA. In this embodiment, the signal C[9:12] further contains the comparison result of the aforementioned identification code RRID. If the address to be compared AD is the error address FA, replacement of the redundant memory cell is performed.

In this embodiment, all of the XOR gates XOR_1-XOR_10 are used in the normal mode for comparison operations, however, only the XOR gates XOR_1-XOR_4 are used in the burn in mode to generate the control signal R0N. In other words, the first logic circuit LG_11 disclosed in the present invention can be used in the normal mode and the burn in mode, so the circuit area can be saved.

Please refer to FIG. 7, for the convenience of understanding, only the generation circuit of EN_1[0] is shown. The second logic unit LG_21 comprises NOR gates NOR_1-NOR_2, NAND gates NA_3-NA_4, and inverters IV_1-IV_3. The NOR gate NOR_1 is used as a receiving logic unit, to receive the aforementioned second part of bits AN[1:2] and their inverted signals in sequence. The NAND gate NA_4 and the inverter IV_2-IV_3 form a first path, which receives the output of the NOR gate NOR_1 in the normal mode, to select which one of E-fuse section's data in FIG. 1 is to be used. The NOR gate NOR_2, the NAND gate NA_3 and the inverter IV_1 form a second path, which receives the control signal R0N_1 and output of the NOR gate NOR_1 in the burn in mode, to generate the selection signal EN_1[0], to control whether the E-fuse block EB_1 is activated. The signals BNEF and $\overline{RRT}$ are used to enable the first path and the second path, respectively. Similarly, the second logic circuit LG_21 disclosed in the present invention can be used in the normal mode and the burn in mode, so the circuit area can be saved.

In view of above-mentioned embodiments, the present invention can share the latch circuit in the normal mode and the burn in mode, and the logic circuit used in the present invention can share the circuit with the conventional comparison circuit, so that the area required for the circuit can be reduced. In addition, the present invention replaces the decoder in the prior art with a simpler logic circuit, which can reduce the complexity of circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An E-fuse circuit, comprising:
    an E-fuse group, comprising a plurality of E-fuse sections, wherein each one of the E-fuse sections comprises a plurality of E-fuses;
    a multi-mode latch circuit, configured to receive an input signal to generate a first output signal in a burn in mode, and configured to receive an address to be compared to generate a second output signal in a normal mode;
    a first logic circuit group, configured to receive a first part of bits of the first output signal to generate a control signal in the burn in mode; and
    a second logic circuit group, configured to receive the control signal and a second part of bits of the first output signal to generate a selection signal in the burn in mode, to select which one of the E-fuse sections is activated.

2. The E-fuse circuit of claim 1, wherein the first output signal is an m-bit signal transmitted in parallel, and the second output signal is an n-bit signal transmitted in parallel, m, n are positive integers and m<n.

3. The E-fuse circuit of claim 1, wherein a bit number of the first part of bits is larger than a bit number of the second part of bits.

4. The E-fuse circuit of claim 1, wherein the first logic circuit is configured to compare the address to be compared and at least one error address stored by the E-fuse group, to determine whether the address to be compared is the error address.

5. The E-fuse circuit of claim 1, wherein the first logic circuit group further receives an identification code and compares the first part of bits and the identification code to generate the control signal, wherein each one of the E-fuse sections has a corresponding identification code.

6. The E-fuse circuit of claim 5, wherein the first logic circuit group comprises a plurality of first logic circuits, and each one of the first logic circuits comprises:
    a plurality of logic units, configured to receive different bits of the first part of bits in parallel in the burn in mode to generate the control signal, and configured to receive different bits of the second output signal in parallel and the error addresses stored in the E-fuse group in parallel in the normal mode;
    wherein at least one of the logic units further receives a comparison result of the first part of bits and the identification code.

7. The E-fuse circuit of claim 1, wherein the multi-mode latch circuit further comprises:
    at least one latch circuit, configured to generate different bits of the first output signal according to different bits of the input signal in the burn in mode, and configured to generate different bits of the second output signal according to different bits of the address to be compared in the normal mode;
    at least one multiplexer, configured to receive the different bits of the input signal and to respectively output one of the different bits of the input signal to the latch circuit, and configured to receive different bits of the address to be compared and to respectively output one of the different bits of the address to be compared to the latch circuit.

8. The E-fuse circuit of claim 1, wherein the first logic circuit group comprises a plurality of first logic circuits, wherein each one of the first logic circuits comprises:
    a plurality of logic units, configured to receive different bits of the first part of bits in parallel in the burn in mode to generate the control signal, and configured to receive different bits of the second output signal in parallel and the error addresses stored in the E-fuse group in parallel in the normal mode.

9. The E-fuse circuit of claim 8, wherein only partial of the logic units generates the control signal in the burn in mode, but all of the logic units receives the different bits of the second output signal and the error address in the normal mode.

10. The E-fuse circuit of claim 1, wherein the second logic circuit group comprises a plurality of second logic circuits, and each one of the second logic circuits comprises:
    a receiving logic unit, configured to receive the second part of bits and inverted signals of the second part of bits;

a first path, configured to receive output of the receiving logic unit in the normal mode, to select which one of E-fuse section's data recorded is to be used;

a second path, configured to receive the control signal and an output of the receiving logic unit in the burn in mode, to generate the selection signal.

* * * * *